US012562214B2

(12) United States Patent (10) Patent No.: US 12,562,214 B2
Brox et al. (45) Date of Patent: Feb. 24, 2026

(54) COMMAND CLOCK STRUCTURE

(71) Applicant: Micron Technology, Inc., Boise, ID (US)

(72) Inventors: Martin Brox, Munich (DE); Thomas Hein, Munich (DE); Filippo Vitale, Dachau (IT)

(73) Assignee: Micron Technology, Inc., Boise, ID (US)

( * ) Notice: Subject to any disclaimer, the term of this patent is extended or adjusted under 35 U.S.C. 154(b) by 141 days.

(21) Appl. No.: 18/520,175

(22) Filed: Nov. 27, 2023

(65) Prior Publication Data

US 2024/0185909 A1 Jun. 6, 2024

Related U.S. Application Data

(60) Provisional application No. 63/386,259, filed on Dec. 6, 2022.

(51) Int. Cl.
*G11C 11/00* (2006.01)
*G11C 11/406* (2006.01)
*G11C 11/4072* (2006.01)
*G11C 11/4076* (2006.01)

(52) U.S. Cl.
CPC .... *G11C 11/4076* (2013.01); *G11C 11/40615* (2013.01); *G11C 11/4072* (2013.01)

(58) Field of Classification Search
CPC ... G11C 7/222; G11C 11/4076; G11C 11/221; G11C 11/2293; G11C 7/22; G11C 11/4023; G11C 7/04; G11C 2029/0403; G11C 29/12015; G11C 7/1051; G11C 7/1066; G11C 11/4096; G11C 29/56004; G11C 7/1072; G11C 11/40615; G11C 11/4072; G11C 11/4074; G11C 13/0038; G11C 5/063; G11C 5/14; G11C 5/144; G11C 5/148; G11C 7/00; G11C 7/02; G11C 7/1006; G11C 7/1048; G11C 7/106; G11C 7/1078; G11C 7/1087; G11C 7/1093; G11C 29/04; G11C 29/1201; G11C 29/14; G11C 5/025; G11C 8/08; G11C 8/10; G11C 8/12; G11C 8/18
See application file for complete search history.

(56) References Cited

U.S. PATENT DOCUMENTS 8,045,663 B2 * 10/2011 Bae ........................ G11C 7/222
712/E9.063

* cited by examiner

*Primary Examiner* — Thong Q Le
(74) *Attorney, Agent, or Firm* — Holland & Hart LLP

(57) ABSTRACT

Methods, systems, and devices for command clock structure are described. A memory device may receive a command to determine a relationship (e.g., a phase relationship) between an external clock and an internally generated clock. In some examples, the memory device may execute the command and may report (e.g., to a host device) whether the command is successfully or unsuccessfully executed. The memory device may report the successful or unsuccessful execution of the command by driving one or more pins to a first value or a second value.

20 Claims, 5 Drawing Sheets

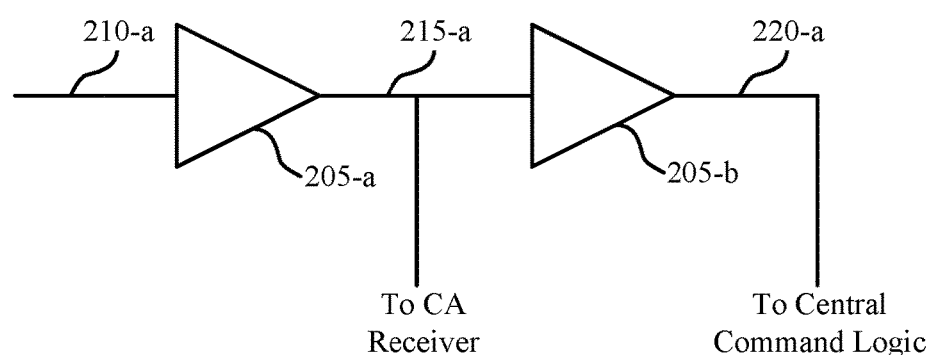
210-a    215-a    220-a
205-a    205-b
To CA
Receiver
To Central
Command Logic
200-a
FIG. 2A
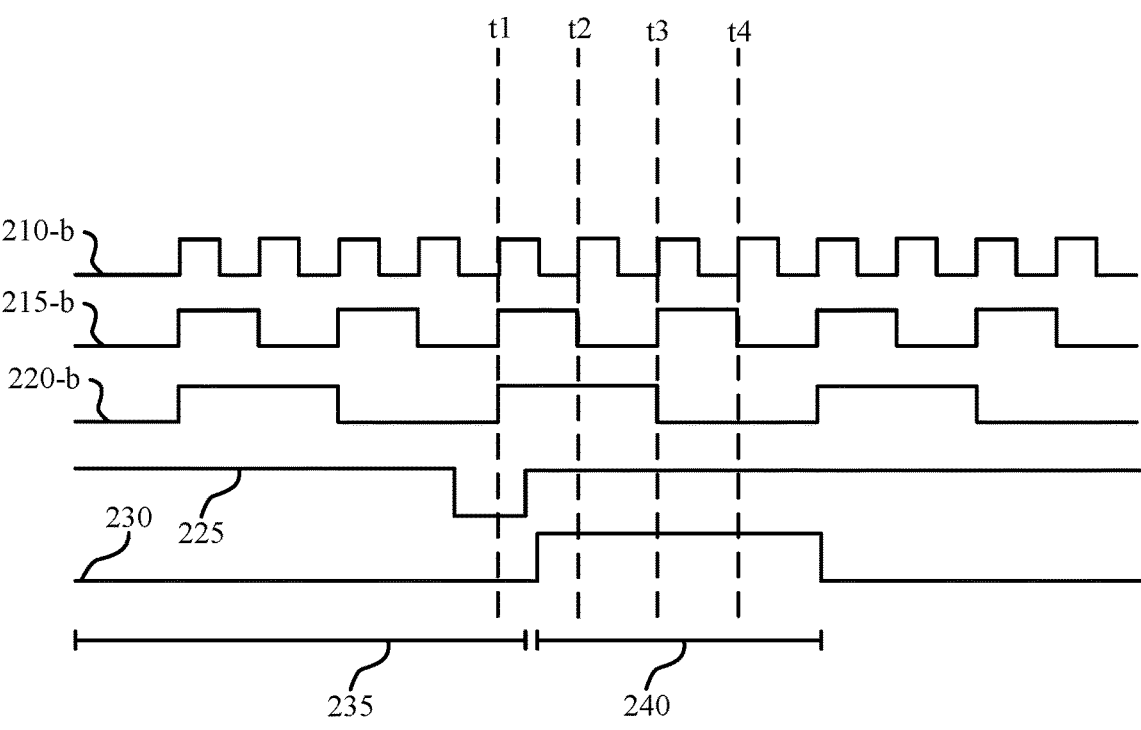
t1    t2    t3    t4
210-b
215-b
220-b
230    225
235    240
FIG. 2B    200-b

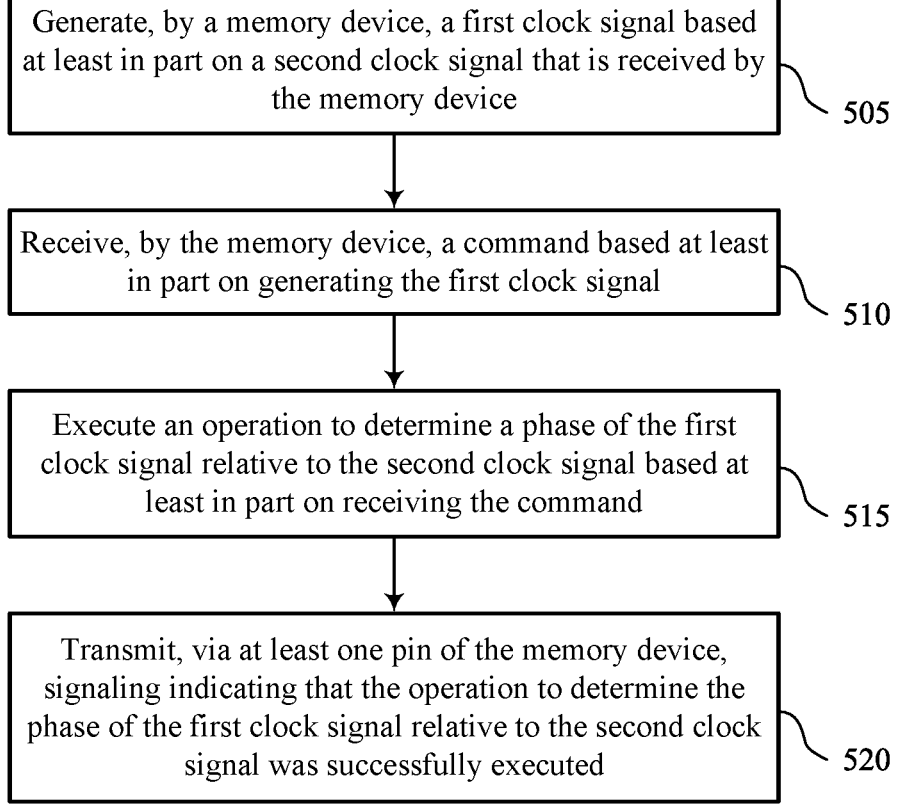

Generate, by a memory device, a first clock signal based at least in part on a second clock signal that is received by the memory device

505

Receive, by the memory device, a command based at least in part on generating the first clock signal

510

Execute an operation to determine a phase of the first clock signal relative to the second clock signal based at least in part on receiving the command

515

Transmit, via at least one pin of the memory device, signaling indicating that the operation to determine the phase of the first clock signal relative to the second clock signal was successfully executed

COMMAND CLOCK STRUCTURE

CROSS REFERENCE

The present Application for Patent claims the benefit of U.S. Provisional Patent Application No. 63/386,259 by BROX et al., entitled "COMMAND CLOCK STRUC-TURE," filed Dec. 6, 2022, assigned to the assignee hereof, and expressly incorporated by reference herein.

TECHNICAL FIELD

The following relates to one or more systems for memory, including command clock structure.

BACKGROUND

Memory devices are widely used to store information in devices such as computers, user devices, wireless communication devices, cameras, digital displays, and others. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, the memory device may read (e.g., sense, detect, retrieve, determine) states from the memory cells. To store information, the memory device may write (e.g., program, set, assign) states to the memory cells.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

BRIEF DESCRIPTION OF THE DRAWINGS

FIG. 2A illustrates an example of a circuit that supports command clock structure in accordance with examples as disclosed herein.

FIG. 2B illustrates an example of a timing diagram that supports command clock structure in accordance with examples as disclosed herein.

FIG. 5 illustrates a flowchart showing a method or methods that support command clock structure in accordance with examples as disclosed herein.

DETAILED DESCRIPTION

Some memory systems (e.g., dynamic random access memory (DRAM) memory systems) may utilize clock signals to operate data paths and for operations performed by components of the memory device. For example, a memory device may receive commands according to an external clock (e.g., a write clock (WCK)) and may execute the commands according to an internal clock (e.g., CK2, CK4). In some instances, the internal clock may be generated using the external clock. However, because the external clock and internal clock may run at different frequencies, a misalignment (e.g., a phase offset) between the clocks may exist.

Accordingly, the memory device may issue a command (e.g., a command start point (CSP)) during initialization that indicates the relation between the internal clock and the external clock. However, the memory device may not include capabilities to report whether the CSP command is successfully executed. Accordingly, if the CSP command is unsuccessfully executed, the memory device may experience a non-recoverable error during the initialization of the memory device. Thus a memory device configured to successfully report the execution of CSP commands may be desirable.

A memory device configured to successfully report the execution of CSP commands is described herein. In some examples, a memory device may receive a CSP command to determine a relationship between an external clock and an internally generated clock. For example, the memory device may determine a phase of the external clock relative to a phase of the internal clock, which may be used by a component of the memory device (e.g., a controller of the memory device) to execute commands received from a host device.

In response to the CSP command being successfully (or unsuccessfully) executed, the memory device may indicate the successful (or unsuccessful) execution of the CSP command by driving one or more dedicated pins to a specific voltage. For example, if the CSP command is successfully executed, the memory device may drive an ERR pin to a first value (e.g., a high value) and if the CSP command is unsuccessfully executed, the memory device may drive the ERR pin (or refrain from driving the ERR pin) to a second value (e.g., a low value), which may result in the host device retransmitting the CSP command. Accordingly, reporting the successful execution of CSP commands may increase the reliability of the memory device by mitigating or reducing the likelihood of non-recoverable errors during initialization.

Figure 1:
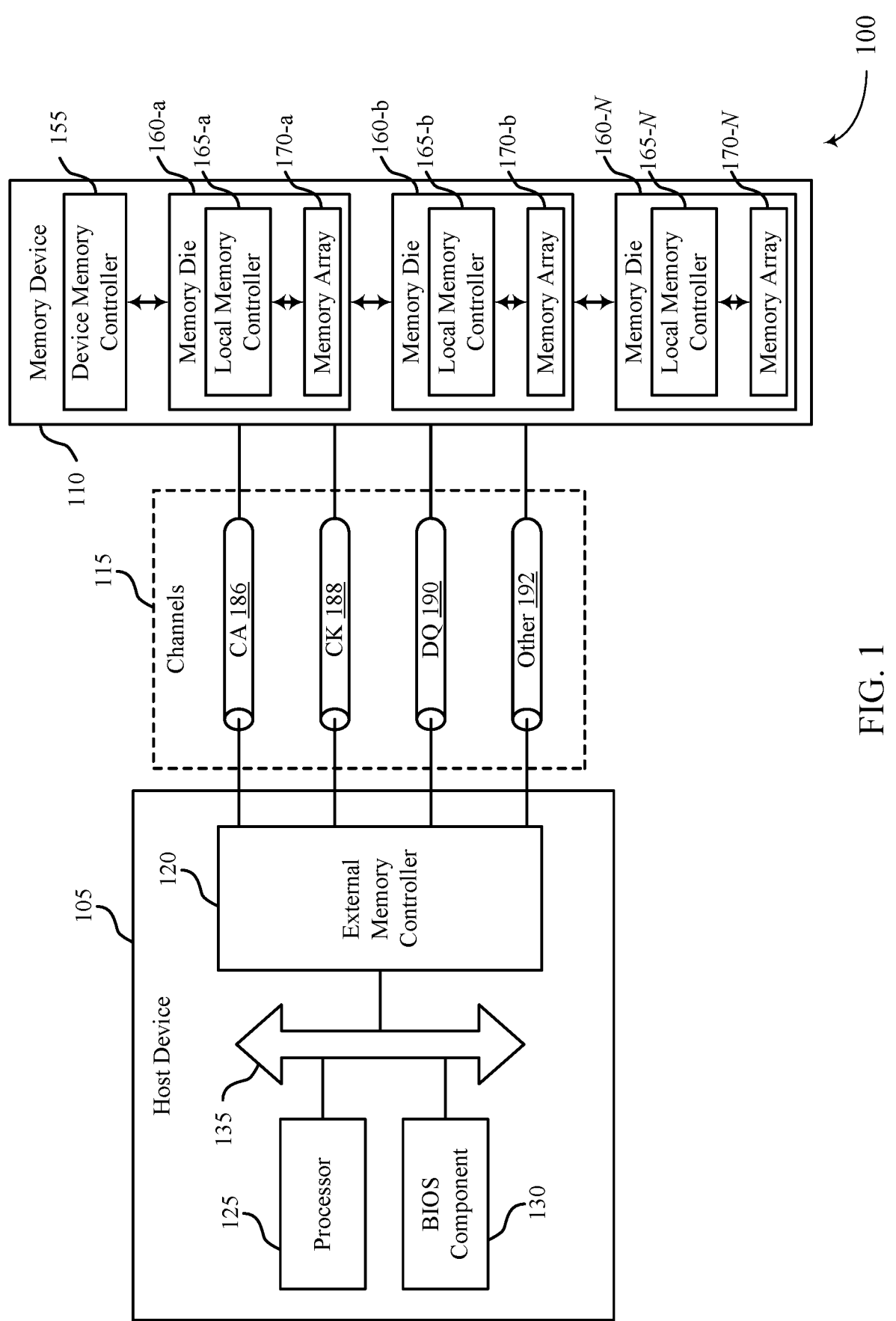
FIG. 1 illustrates an example of a system that supports command clock structure in accordance with examples as disclosed herein.

Features of the disclosure are initially described in the context of systems with reference to FIG. 1. Features of the disclosure are described in the context of circuit diagrams, timing diagrams, and process flow diagrams as described with reference to FIGS. 2A, 2B, and 3. These and other features of the disclosure are further illustrated by and described with reference to an apparatus diagram and flowcharts that relate to command clock structure as described with reference to FIGS. 4 and 5.

FIG. 1 illustrates an example of a system 100 that supports command clock structure in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system 100 that is operable to store data for one or more other components of the system 100.

Portions of the system 100 may be examples of the host device 105. The host device 105 may be an example of a processor (e.g., circuitry, processing circuitry, a processing component) within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or any combination thereof that implements the functions of an external memory controller 120. In some examples, the external memory controller 120 may be referred to as a host (e.g., host device 105).

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other functions.

The memory device 110 may be operable to store data for the components of the host device 105. In some examples, the memory device 110 (e.g., operating as a secondary-type device to the host device 105, operating as a dependent-type device to the host device 105) may respond to and execute commands provided by the host device 105 through the external memory controller 120. Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide functionality (e.g., control functionality) for the system 100 or the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or any combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include instructions (e.g., a program, software) stored in one or more of read-only memory (ROM), flash memory, or other non-volatile memory.

The memory device 110 may include a device memory controller 155 and one or more memory dies 160 (e.g., memory chips) to support a capacity (e.g., a desired capacity, a specified capacity) for data storage. Each memory die 160 (e.g., memory die 160-*a*, memory die 160-*b*, memory die 160-N) may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store one or more bits of data. A memory device 110 including two or more memory dies 160 may be referred to as a multi-die memory or a multi-die package or a multi-chip memory or a multi-chip package.

The device memory controller 155 may include components (e.g., circuitry, logic) operable to control operation of the memory device 110. The device memory controller 155 may include hardware, firmware, or instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may communicate information (e.g., data, commands, or both) with the host device 105. For example, the memory device 110 may receive a write command indicating that the memory device 110 is to store data received from the host device 105, or receive a read command indicating that the memory device 110 is to provide data stored in a memory die 160 to the host device 105, among other types of information communication.

A local memory controller 165 (e.g., local to a memory die 160) may include components (e.g., circuitry, logic) operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or any combination thereof.

Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other components operable for supporting described operations of the device memory controller 155 or local memory controller 165 or both.

The external memory controller 120 may be operable to enable communication of information (e.g., data, commands, or both) between components of the system 100 (e.g., between components of the host device 105, such as the processor 125, and the memory device 110). The external memory controller 120 may process (e.g., convert, translate) communications exchanged between the components of the host device 105 and the memory device 110. In some examples, the external memory controller 120, or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be an example of a transmission medium that carries information between the host device 105 and the memory device 110. Each channel 115 may include one or more signal paths (e.g., a transmission medium, a conductor) between terminals associated with the components of the system 100. A signal path may be an example of a conductive path operable to carry a signal. For example, a channel 115 may be associated with a first terminal (e.g., including one or more pins, including one or more pads) at the host device 105 and a second terminal at the memory device 110. A terminal may be an example of a conductive input or output point of a device of the system 100, and a terminal may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or any combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CK channels 188 may be operable to communicate one or more clock signals between the host device 105 and the memory device 110. Clock signals may be operable to oscillate between a high state and a low state, and may support coordination (e.g., in time) between actions of the host device 105 and the memory device 110. In some examples, the clock signal may be single ended. In some examples, the clock signal may provide a timing reference for command and addressing operations for the memory device 110, or other system-wide operations for the memory device 110. A clock signal may be referred to as a control clock signal, a command clock signal, or a system clock signal. A system clock signal may be generated by a system clock, which may include one or more hardware components (e.g., oscillators, crystals, logic gates, transistors).

In some examples, the memory device 110 may receive a CSP command (e.g., from the host device 105) to determine a relationship between an external clock (e.g., a clock received via CK channels 188) and an internally generated clock (e.g., a clock generated by the device memory controller 155 or another component of the memory device 110). For example, the memory device 110 may determine a phase of the external clock relative to a phase of the internal clock, which may be used by a component of the memory device 110 (e.g., a device memory controller 155) to execute commands received from a host device 105.

When the CSP command is successfully (or unsuccessfully) executed, the memory device 110 may indicate the successful (or unsuccessful) execution of the CSP command by driving one or more dedicated pins. For example, if the CSP command is successfully executed, the memory device 110 may drive an ERR pin to a first value (e.g., a high value) and if the CSP command is unsuccessfully executed, the memory device 110 may drive the ERR pin (or refrain from driving the ERR pin) to a second value (e.g., a low value), which may result in the host device 105 retransmitting the CSP command. Accordingly, reporting the successful execution of CSP commands may increase the reliability of the memory device 110 by mitigating or reducing the likelihood of non-recoverable errors during initialization.

FIG. 2A illustrates an example of a circuit 200-*a* that supports command clock structure in accordance with examples as disclosed herein. In some examples, the circuit 200-*a* may include one or more frequency divider components 205. The circuit 200-*a* may receive an external clock signal (e.g., a clock received via CK channels 188 as described with reference to FIG. 1) and may generate one or more internal clock signals that are provided to components of a memory device (e.g., a memory device 110 as described with reference to FIG. 1). In some instances, the associated memory device may receive a CSP command and may report the successful (or unsuccessful) execution of the CSP command, which may increase the reliability of the associated memory device by mitigating or reducing the likelihood of non-recoverable errors during initialization.

The circuit 200-*a* may include a first frequency divider component 205-*a* and a second frequency divider component 205-*b*. In some examples, each frequency divider component 205 may divide a frequency of a received signal by two (2). In other examples, the circuit 200-*a* may include any quantity of frequency divider components 205, and each frequency divider component may divide a frequency of a received signal by any quantity (e.g., two, four, eight, sixteen, etc.).

The first frequency divider component 205-*a* may receive an external clock signal 210-*a* (e.g., WCK 210-*a*, a second clock signal 210-*a*) as an input. WCK 210-*a* may be received from a host device via one or more clock channels (e.g., from a host device 105 via CK channels 188 as described with reference to FIG. 1). In some examples, WCK 210-*a* may be associated with a first frequency. The first frequency divider component 205-*a* may divide the frequency of WCK 210-*a* by a value (e.g., by two, four, eight, etc.). By way of example, the first frequency divider component 205-*a* may divide the frequency of WCK 210-*a* by two (2), and may output a first internally generated clock signal (e.g., CK2 215-*a*). In some examples, CK2 215-*a* may be provided to a CA receiver of the associated memory device and also as an input to a second frequency divider component 205-*b*.

The second frequency divider component 205-*b* may receive CK2 215-*a* as an input. The second frequency divider component 205-*b* may receive CK2 215-*a* via one or more internal channels (e.g., one or more channels internal to the memory device). In some examples, CK2 215-*a* may be associated with a second frequency. The second frequency divider component 205-*b* may divide the frequency of CK2 215-*a* by a value (e.g., by two, four, eight, etc.). By way of example, the second frequency divider component 205-*b* may divide the frequency of CK2 215-*a* by two (2), and may output a second internally generated clock signal (e.g., CK4 220-*a*, a first clock signal). Thus CK4 220-*a* may be generated by performing two successive divide-by-two operations on WCK 210-*a*. In some examples, CK4 220-*a* may be provided to a central command logic (e.g., a controller, a memory device controller 155 as described with reference to FIG. 1) of a memory device.

As described herein, because CK4 220-*a* is generated internally (e.g., generated by a memory device using the circuit 200-*a*), a phase of WCK 210-*a* and a phase of CK4 may be misaligned. Accordingly, a host device may issue a CSP command to the memory device. The memory device may execute the CSP command to determine a phase relationship between WCK 210-*a* and CK4 220-*a*, which may allow for the memory device to successfully execute commands. Moreover, the memory device may report the successful (or unsuccessful) execution of the CSP command to increase its reliability and to mitigate or reduce the likelihood of non-recoverable errors during initialization.

FIG. 2B illustrates an example of a timing diagram 200-*b* that supports command clock structure in accordance with examples as disclosed herein. In some examples, the timing diagram 200-*b* may illustrate the timing of an external clock signal (e.g., WCK 210-*b*, a second clock signal), a first internally generated clock signal (e.g., CK2 215-*b*), and a second internally generated clock signal (e.g., CK4 220-*b*, a first clock signal), which may be examples of WCK 210-*a*, CK2 215-*a*, and CK4 220-*a* as described with reference to FIG. 2A. The timing diagram 200-*b* may also illustrate the timing of a CSP command line 225 and an output of one or more pins 230. In some instances, the associated memory device may receive a CSP command and may report the successful (or unsuccessful) execution of the CSP command, which may increase the reliability of the associated memory device by mitigating or reducing the likelihood of non-recoverable errors during initialization.

As described herein, the WCK 210-*b* may be an external clock signal that is used to operate a data path between a host device and a memory device (e.g., a host device 105 and a memory device 110, respectively, as described with reference to FIG. 1). For example, the WCK 210-*b* may be used to operate a CA channel 186, a DQ channel 190, or both as described with reference to FIG. 1. The WCK 210-*b* may be associated with a first frequency, which may be greater than (e.g., faster than), for example CK2 215-*b*, CK4 220-*b*, or both.

Additionally or alternatively, CK2 215-*b* and CK4 220-*b* may each be generated internally (e.g., by a memory device)

using the circuit 200-*a* as described with reference to FIG. 2A. The CK2 215-*b* may be associated with a second frequency, which may be greater than (e.g., faster than), for example CK4 220-*b* but may be less than (e.g., slower than) WCK 210-*b*. In other examples, the CK4 220-*b* may be associated with a third frequency, which may be less than (e.g., slower than) WCK 210-*b*, CK2 215-*b*, or both.

A CSP command may be transmitted to the memory device according to WCK 210-*b*, which may allow the memory device to determine a relationship between WCK 210-*b* and CK4 220-*b*. In some examples, a phase of CK4 220-*b* may be aligned with a phase of WCK 210-*b*. In other examples, a phase of CK4 220-*b* may be offset from a phase of WCK 210-*b* by, for example, ninety (90) degrees, one-hundred eighty (180)) degrees, or two-hundred seventy (270) degrees. Whether a phase of CK4 220-*b* is aligned with or offset from a phase of WCK 210-*b* may be determined based on when a CSP command is received relative to a first edge (e.g., a rising edge) of CK4 220-*b*.

In a first example, a CSP command may be received at or prior to time t1. Prior to receiving a CSP command, the CSP command line 225 may be driven to a first value (e.g., a high value). The memory device (e.g., a controller of the memory device) may select an edge of CK4 220-*b* to begin executing the CSP command. Accordingly, as shown in FIG. 2B, the memory device begin executing the CSP command when the CSP command line 225 is driven to a second value (e.g., a low value), which may coincide with a rising edge of CK4 220-*b*. In such examples, a phase of CK4 220-*b* may be aligned with (e.g., zero degrees offset from) a phase of WCK 210-*b*.

After the CSP command is executed, the CSP command line 225 may be driven to the first value. If the CSP command is successfully executed, one or more pins 230 (e.g., an ERR pin 230) may be driven to a first value (e.g., a high value) for a duration 240 (e.g., a first duration). In some examples, the duration 240 may last for one or more cycles of CK4 220-*b*. Additionally or alternatively, the one or more pins 230 may be driven to a second value (e.g., a low value) for a duration 235 (e.g., a second duration) that precedes the duration 240).

In a second example (not shown), a CSP command may be received at or prior to time t2. Prior to receiving a CSP command, the CSP command line 225 may be driven to a first value (e.g., a high value). The memory device (e.g., a controller of the memory device) may select an edge of CK4 220-*b* to begin executing the CSP command. Accordingly, the memory device begin executing the CSP command when the CSP command line 225 is driven to a second value (e.g., a low value), which may occur after a rising edge of CK4 220-*b*. In such examples, a phase of CK4 220-*b* may be offset from a phase of WCK 210-*b* by ninety (90) degrees.

After the CSP command is executed, the CSP command line 225 may be driven to the first value. If the CSP command is successfully executed, one or more pins 230 (e.g., an ERR pin 230) may be driven to a first value (e.g., a high value) for a duration (e.g., a first duration). In some examples, the duration may last for one or more cycles of CK4 220-*b*. Additionally or alternatively, the one or more pins 230 may be driven to a second value (e.g., a low value) for a duration (e.g., a second duration) that precedes the first duration.

In a third example (not shown), a CSP command may be received at or prior to time t3. Prior to receiving a CSP command, the CSP command line 225 may be driven to a first value (e.g., a high value). The memory device (e.g., a controller of the memory device) may select an edge of CK4

220-*b* to begin executing the CSP command. Accordingly, the memory device begin executing the CSP command when the CSP command line 225 is driven to a second value (e.g., a low value), which may coincide with a falling edge of CK4 220-*b*. In such examples, a phase of CK4 220-*b* may be offset from a phase of WCK 210-*b* by one-hundred eighty (180) degrees.

After the CSP command is executed, the CSP command line 225 may be driven to the first value. If the CSP command is successfully executed, one or more pins 230 (e.g., an ERR pin 230) may be driven to a first value (e.g., a high value) for a duration (e.g., a first duration). In some examples, the duration may last for one or more cycles of CK4 220-*b*. Additionally or alternatively, the one or more pins 230 may be driven to a second value (e.g., a low value) for a duration (e.g., a second duration) that precedes the first duration.

In a fourth example (not shown), a CSP command may be received at or prior to time t4. Prior to receiving a CSP command, the CSP command line 225 may be driven to a first value (e.g., a high value). The memory device (e.g., a controller of the memory device) may select an edge of CK4 220-*b* to begin executing the CSP command. Accordingly, the memory device begin executing the CSP command when the CSP command line 225 is driven to a second value (e.g., a low value), which may occur after a falling edge of CK4 220-*b*. In such examples, a phase of CK4 220-*b* may be offset from a phase of WCK 210-*b* by two-hundred seventy (270)) degrees.

After the CSP command is executed, the CSP command line 225 may be driven to the first value. If the CSP command is successfully executed, one or more pins 230 (e.g., an ERR pin 230) may be driven to a first value (e.g., a high value) for a duration (e.g., a first duration). In some examples, the duration may last for one or more cycles of CK4 220-*b*. Additionally or alternatively, the one or more pins 230 may be driven to a second value (e.g., a low value) for a duration (e.g., a second duration) that precedes the first duration.

In the examples described herein, a CSP command may be unsuccessfully executed. A controller or other component of a memory device may determine whether a CSP command is successfully or unsuccessfully executed. If a CSP command is unsuccessfully executed, the memory device may drive the one or more pins 230 to a second value. Accordingly, the host device may determine (e.g., based on the one or more pins 230) being driven to the second value) that the CSP command was unsuccessfully executed and may transmit (e.g., retransmit) a CSP command. The process described herein may repeat until the CSP command is successfully executed.

In some instances, the memory device may receive a CSP command each time it is initialized. The memory device may be initialized, for example, after a refresh (e.g., a self-refresh) operation is performed, when a host device changes operations, a frequency of one or more signals, or a voltage of one or more signals. Moreover, the memory device may be initialized if it enters a low power state (e.g., a reduced power state, a hibernate state).

Additionally or alternatively, the memory device may use any pin (or quantity of pins) to indicate that a CSP command was successfully performed. For example, the memory device may dedicate a particular pin, such as an ERR pin, for use in indicating the successful execution of CSP commands. However, in other examples, any pin (or pins) of the memory device may be used for indicating the successful execution of CSP commands. By reporting the successful (or unsuccessful) execution of the CSP commands, the memory device's reliability may be increased, and its ability to mitigate or reduce the likelihood of non-recoverable errors during initialization may be improved.

Figure 3:
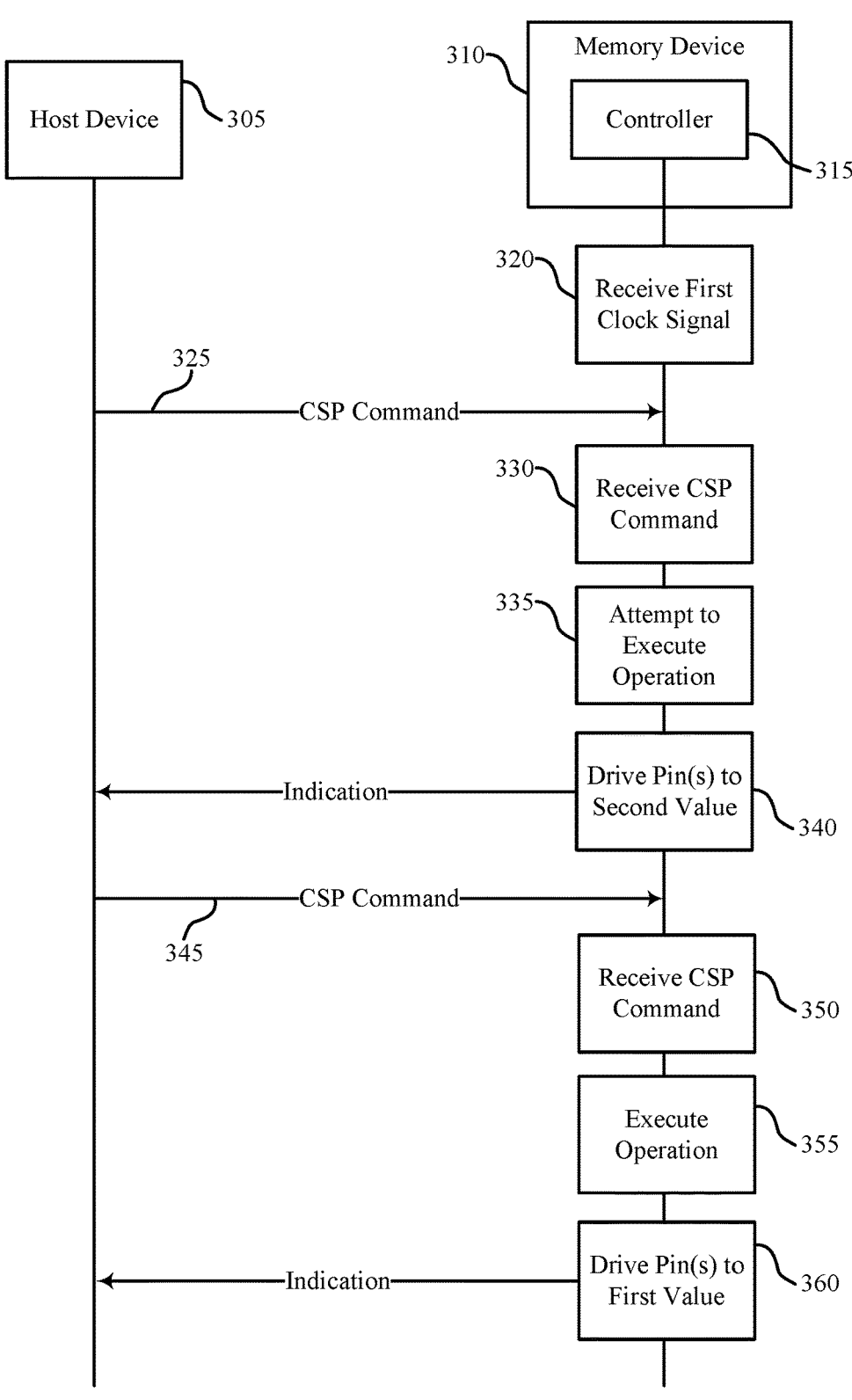
FIG. 3 illustrates an example of a process flow that supports command clock structure in accordance with examples as disclosed herein.

FIG. 3 illustrates an example of a process flow 300 that supports command clock structure in accordance with examples as disclosed herein. In some examples, the process flow diagram may illustrate operations by a host device 305 and a controller 315 of a memory device 310. The memory device 310 may receive CSP commands and may report the successful (or unsuccessful) execution of the commands, which may increase the reliability of the memory device 310 by mitigating or reducing the likelihood of non-recoverable errors during initialization.

In some examples, the process flow 300 may illustrate operations associated with receiving a CSP command. Aspects of the process flow 300 may be implemented by the controller 315, among other components. Additionally, or alternatively, aspects of the process flow 300 may be implemented as instructions stored in memory (e.g., firmware stored in a memory coupled with the controller 315). For example, the instructions, in response to being executed by the controller 315, may cause the controller 315 to perform the operations of the process flow 300.

At 320, the controller 315 may receive a first clock signal (e.g., CK4). As described herein, the first clock signal may be generated by a component of the memory device 310. For example, the first clock signal may be generated by a circuit 200-*a* as described with reference to FIG. 2A. The controller 315 may process one or more commands (e.g., read commands, write commands) according to the first clock signal.

At 325, the host device 305 may transmit a CSP command to the memory device 310. In some examples, the CSP command may be transmitted based on the memory device 310 being initialized. As described herein, the CSP command may be transmitted according to an external clock signal (e.g., a second clock signal, WCK). That is, WCK may be external to the memory device 310. In some examples, the CSP command may be executed (e.g., by the controller 315) to determine a phase relationship between the WCK and CK4.

At 330, the controller 315 may receive the CSP command. The CSP command may be received according to WCK and may be executed according to CK4.

At 335, the controller 315 may attempt to execute the CSP command. As described herein, the CSP command may be executed to determine whether a phase of CK4 is aligned with a phase of WCK, or whether a phase of CK4 is offset (e.g., offset by 90, 180, or 270 degrees) from WCK. In some instances, at 335 the controller 315 may not successfully execute the CSP command.

At 340, the controller 315 may drive one or more pins (e.g., one or more ERR pins) to a second value (e.g., a low value). In some examples, the one or more pins may have been previously driven to the second value and the controller 315 may maintain driving the one or more pins to the second value for a duration (e.g., a first duration). In some examples, the first duration may last one or more cycles of CK4. Based on the one or more pins being driven to the second value for the first duration, an indication may be provided to the host device 305 that the CSP command was unsuccessfully executed.

At 345, the host device 305 may transmit a CSP command to the memory device 310. In some examples the CSP command may be transmitted to the memory device 310 for a second time based on a prior CSP command being unsuccessfully executed.

At 350, the controller 315 may receive the CSP command. The CSP command may be received according to WCK and may be executed according to CK4.

At 355, the controller 315 may execute the CSP command. As described herein, the CSP command may be executed to determine whether a phase of CK4 is aligned with a phase of WCK, or whether a phase of CK4 is offset (e.g., offset by 90, 180, or 270 degrees) from WCK. In some instances, when the CSP command is successfully executed, the controller 315 may determine a relation between a phase of the WCK and a phase of the CK4, which may enable the controller 315 to successfully execute commands received from the host device 305.

At 360, the controller 315 may drive one or more pins (e.g., one or more ERR pins) to a first value (e.g., a high value). In some examples, the one or more pins may have been previously driven to the second value (e.g., for a second duration) and the one or more pins may be driven to the first value for a duration (e.g., a first duration) that lasts one or more cycles of CK4. The one or more pins may be driven to the first value for the duration to ensure that the host device 305 is notified that the CSP command was successfully executed. By reporting the successful (or unsuccessful) execution of the CSP commands, the reliability of the memory device 310 may be increased, and its ability to mitigate or reduce the likelihood of non-recoverable errors during initialization may be improved.

Figure 4:
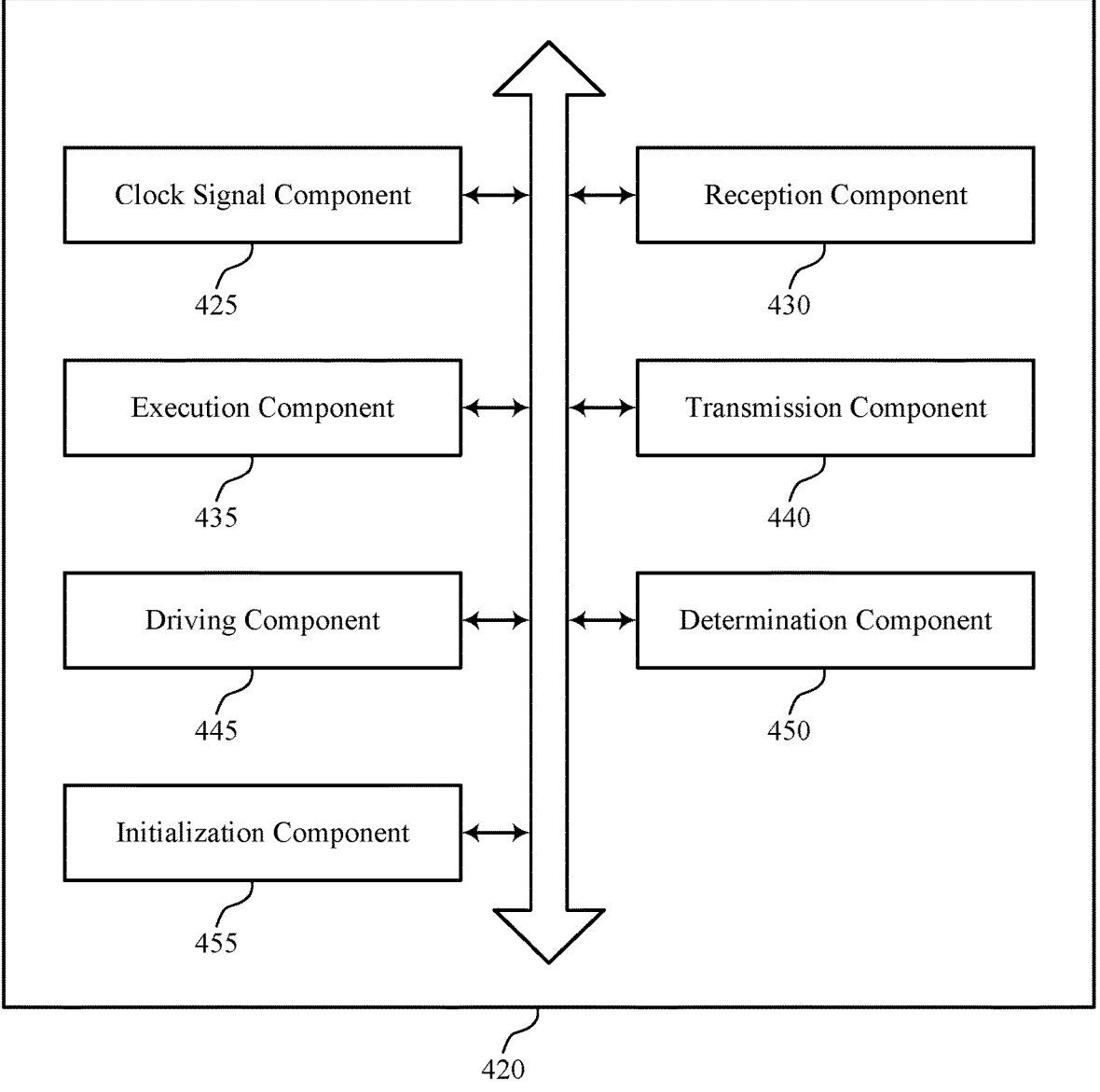
FIG. 4 illustrates a block diagram of a memory device that supports command clock structure in accordance with examples as disclosed herein.

FIG. 4 illustrates a block diagram 400 of a memory device 420 that supports command clock structure in accordance with examples as disclosed herein. The memory device 420 may be an example of aspects of a memory device as described with reference to FIGS. 1 through 3. The memory device 420, or various components thereof, may be an example of means for performing various aspects of command clock structure as described herein. For example, the memory device 420 may include a clock signal component 425, a reception component 430, an execution component 435, a transmission component 440, a driving component 445, a determination component 450, an initialization component 455, or any combination thereof. Each of these components may communicate, directly or indirectly, with one another (e.g., via one or more buses).

The clock signal component 425 may be configured as or otherwise support a means for generating, by a memory device, a first clock signal based at least in part on a second clock signal that is received by the memory device. The reception component 430 may be configured as or otherwise support a means for receiving, by the memory device, a command based at least in part on generating the first clock signal. The execution component 435 may be configured as or otherwise support a means for executing an operation to determine a phase of the first clock signal relative to the second clock signal based at least in part on receiving the command. The transmission component 440 may be configured as or otherwise support a means for transmitting, via at least one pin of the memory device, signaling indicating that the operation to determine the phase of the first clock signal relative to the second clock signal was successfully executed.

In some examples, to support transmitting the signaling indicating that the operation was successfully executed, the driving component 445 may be configured as or otherwise support a means for driving the at least one pin to a first value for a duration, where the duration includes a plurality of cycles of the first clock signal.

In some examples, the driving component 445 may be configured as or otherwise support a means for driving the at least one pin to a second value for a second duration that precedes the duration, where the second duration is associated with an initialization phase of the memory device.

In some examples, the determination component 450 may be configured as or otherwise support a means for determining the phase of the first clock signal relative to the second clock signal based at least in part on executing the operation.

In some examples, the phase of the first clock signal is aligned with the phase of the second clock signal.

In some examples, the phase of the first clock signal is offset from the phase of the second clock signal.

In some examples, the initialization component 455 may be configured as or otherwise support a means for initializing the memory device based at least in part on a host device changing a frequency, the host device changing a voltage, the memory device performing a self-refresh operation, the memory device changing power states, or a combination thereof, where the command is received based at least in part on initializing the memory device.

In some examples, the reception component 430 may be configured as or otherwise support a means for receiving, by the memory device, a second command after transmitting the signaling indicating that the operation was successfully executed, the second command for determining the phase of the first clock signal relative to the second clock signal. In some examples, the execution component 435 may be configured as or otherwise support a means for attempting to execute a second operation based at least in part on receiving the second command. In some examples, the transmission component 440 may be configured as or otherwise support a means for transmitting, via the at least one pin of the memory device, second signaling indicating that the second operation was unsuccessfully executed based at least in part on attempting to execute the second command.

In some examples, the reception component 430 may be configured as or otherwise support a means for receiving, by the memory device, a third command based at least in part on transmitting the second signaling. In some examples, the execution component 435 may be configured as or otherwise support a means for executing a third operation to determine the phase of the first clock signal relative to the second clock signal based at least in part on receiving the third command. In some examples, the transmission component 440 may be configured as or otherwise support a means for transmitting, via the at least one pin of the memory device, third signaling indicating that the third operation was successfully executed to determine the phase of the first clock signal relative to the second clock signal.

In some examples, a frequency of the first clock signal is different than a frequency of the second clock signal.

In some examples, the first clock signal is internal to the memory device.

In some examples, the command includes a command start point command.

FIG. 5 illustrates a flowchart showing a method 500 that supports command clock structure in accordance with examples as disclosed herein. The operations of method 500 may be implemented by a memory device or its components as described herein. For example, the operations of method 500 may be performed by a memory device as described with reference to FIGS. 1 through 4. In some examples, a memory device may execute a set of instructions to control the functional elements of the device to perform the described functions. Additionally, or alternatively, the memory device may perform aspects of the described functions using special-purpose hardware.

At 505, the method may include generating, by a memory device, a first clock signal based at least in part on a second clock signal that is received by the memory device. The operations of 505 may be performed in accordance with examples as disclosed herein. In some examples, aspects of the operations of 505 may be performed by a clock signal component 425 as described with reference to FIG. 4.

At 510, the method may include receiving, by the memory device, a command based at least in part on generating the first clock signal. The operations of 510 may be performed in accordance with examples as disclosed herein. In some examples, aspects of the operations of 510 may be performed by a reception component 430 as described with reference to FIG. 4.

At 515, the method may include executing an operation to determine a phase of the first clock signal relative to the second clock signal based at least in part on receiving the command. The operations of 515 may be performed in accordance with examples as disclosed herein. In some examples, aspects of the operations of 515 may be performed by an execution component 435 as described with reference to FIG. 4.

At 520, the method may include transmitting, via at least one pin of the memory device, signaling indicating that the operation to determine the phase of the first clock signal relative to the second clock signal was successfully executed. The operations of 520 may be performed in accordance with examples as disclosed herein. In some examples, aspects of the operations of 520 may be performed by a transmission component 440 as described with reference to FIG. 4.

In some examples, an apparatus as described herein may perform a method or methods, such as the method 500. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for generating, by a memory device, a first clock signal based at least in part on a second clock signal that is received by the memory device: receiving, by the memory device, a command based at least in part on generating the first clock signal: executing an operation to determine a phase of the first clock signal relative to the second clock signal based at least in part on receiving the command: and transmitting, via at least one pin of the memory device, signaling indicating that the operation to determine the phase of the first clock signal relative to the second clock signal was successfully executed.

Aspect 2: The method, apparatus, or non-transitory computer-readable medium of aspect 1, where transmitting the signaling indicating that the operation was successfully executed includes operations, features, circuitry, logic, means, or instructions, or any combination thereof for driving the at least one pin to a first value for a duration, where the duration includes a plurality of cycles of the first clock signal.

Aspect 3: The method, apparatus, or non-transitory computer-readable medium of aspect 2, further including operations, features, circuitry, logic, means, or instructions, or any combination thereof for driving the at least one pin to a second value for a second duration that precedes the duration, where the second duration is associated with an initialization phase of the memory device.

Aspect 4: The method, apparatus, or non-transitory computer-readable medium of any of aspects 1 through 3, further including operations, features, circuitry, logic, means, or instructions, or any combination thereof for determining the phase of the first clock signal relative to the second clock signal based at least in part on executing the operation.

Aspect 5: The method, apparatus, or non-transitory computer-readable medium of aspect 4, where the phase of the first clock signal is aligned with the phase of the second clock signal.

Aspect 6: The method, apparatus, or non-transitory computer-readable medium of any of aspects 4 through 5, where the phase of the first clock signal is offset from the phase of the second clock signal.

Aspect 7: The method, apparatus, or non-transitory computer-readable medium of any of aspects 1 through 6, further including operations, features, circuitry, logic, means, or instructions, or any combination thereof for initializing the memory device based at least in part on a host device changing a frequency, the host device changing a voltage, the memory device performing a self-refresh operation, the memory device changing power states, or a combination thereof, where the command is received based at least in part on initializing the memory device.

Aspect 8: The method, apparatus, or non-transitory computer-readable medium of any of aspects 1 through 7, further including operations, features, circuitry, logic, means, or instructions, or any combination thereof for receiving, by the memory device, a second command after transmitting the signaling indicating that the operation was successfully executed, the second command for determining the phase of the first clock signal relative to the second clock signal: attempting to execute a second operation based at least in part on receiving the second command: and transmitting, via the at least one pin of the memory device, second signaling indicating that the second operation was unsuccessfully executed based at least in part on attempting to execute the second command.

Aspect 9: The method, apparatus, or non-transitory computer-readable medium of aspect 8, further including operations, features, circuitry, logic, means, or instructions, or any combination thereof for receiving, by the memory device, a third command based at least in part on transmitting the second signaling: executing a third operation to determine the phase of the first clock signal relative to the second clock signal based at least in part on receiving the third command: and transmitting, via the at least one pin of the memory device, third signaling indicating that the third operation was successfully executed to determine the phase of the first clock signal relative to the second clock signal.

Aspect 10: The method, apparatus, or non-transitory computer-readable medium of any of aspects 1 through 9, where a frequency of the first clock signal is different than a frequency of the second clock signal.

Aspect 11: The method, apparatus, or non-transitory computer-readable medium of any of aspects 1 through 10, where the first clock signal is internal to the memory device.

Aspect 12: The method, apparatus, or non-transitory computer-readable medium of any of aspects 1 through 11, where the command includes a command start point command.

It should be noted that the methods described herein describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, or symbols of signaling that may be referenced throughout the above description may be represented by voltages, currents, electromagnetic waves, magnetic fields or particles, optical fields or particles, or any combination thereof. Some drawings may illustrate signals as a single signal: however, the signal may represent a bus of signals, where the bus may have a variety of bit widths.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
generating, by a memory device, a first clock signal based at least in part on a second clock signal that is received by the memory device;
receiving, by the memory device, a command based at least in part on generating the first clock signal;
executing an operation to determine a phase of the first clock signal relative to the second clock signal based at least in part on receiving the command; and
transmitting, via at least one pin of the memory device, signaling indicating that the operation to determine the phase of the first clock signal relative to the second clock signal was successfully executed.

2. The method of claim 1, wherein transmitting the signaling indicating that the operation was successfully executed comprises:
driving the at least one pin to a first value for a duration, wherein the duration comprises a plurality of cycles of the first clock signal.

3. The method of claim 2, further comprising:
driving the at least one pin to a second value for a second duration that precedes the duration, wherein the second duration is associated with an initialization phase of the memory device.

4. The method of claim 1, further comprising:
determining the phase of the first clock signal relative to the second clock signal based at least in part on executing the operation.

5. The method of claim 4, wherein the phase of the first clock signal is aligned with the phase of the second clock signal.

6. The method of claim 4, wherein the phase of the first clock signal is offset from the phase of the second clock signal.

7. The method of claim 1, further comprising:
initializing the memory device based at least in part on a host device changing a frequency, the host device changing a voltage, the memory device performing a self-refresh operation, the memory device changing power states, or a combination thereof, wherein the command is received based at least in part on initializing the memory device.

8. The method of claim 1, further comprising:
receiving, by the memory device, a second command after transmitting the signaling indicating that the operation was successfully executed, the second command for determining the phase of the first clock signal relative to the second clock signal;
attempting to execute a second operation based at least in part on receiving the second command; and
transmitting, via the at least one pin of the memory device, second signaling indicating that the second operation was unsuccessfully executed based at least in part on attempting to execute the second command.

9. The method of claim 8, further comprising:
receiving, by the memory device, a third command based at least in part on transmitting the second signaling;
executing a third operation to determine the phase of the first clock signal relative to the second clock signal based at least in part on receiving the third command; and
transmitting, via the at least one pin of the memory device, third signaling indicating that the third operation was successfully executed to determine the phase of the first clock signal relative to the second clock signal.

10. The method of claim 1, wherein a frequency of the first clock signal is different than a frequency of the second clock signal.

11. The method of claim 1, wherein the first clock signal is internal to the memory device.

12. The method of claim 1, wherein the command comprises a command start point command.

13. An apparatus, comprising:
a controller associated with a memory device comprising at least one pin, wherein the controller is configured to cause the apparatus to:
generate a first clock signal based at least in part on a second clock signal that is received by the memory device;
receive a command based at least in part on generating the first clock signal;
execute an operation to determine a phase of the first clock signal relative to the second clock signal based at least in part on receiving the command; and
transmit, via the at least one pin of the memory device, signaling indicating that the operation to determine the phase of the first clock signal relative to the second clock signal was successfully executed.

14. The apparatus of claim 13, wherein to transmit the signaling indicating that the operation was successfully executed, the controller is configured to cause the apparatus to:
drive the at least one pin to a first value for a duration, wherein the duration comprises a plurality of cycles of the first clock signal.

15. The apparatus of claim 14, wherein the controller is further configured to cause the apparatus to:
drive the at least one pin to a second value for a second duration that precedes the duration, wherein the second duration is associated with an initialization phase of the memory device.

16. The apparatus of claim 13, wherein the controller is further configured to cause the apparatus to:
determine the phase of the first clock signal relative to the second clock signal based at least in part on executing the operation.

17. The apparatus of claim 16, wherein the phase of the first clock signal is aligned with the phase of the second clock signal.

18. The apparatus of claim 16, wherein the phase of the first clock signal is offset from the phase of the second clock signal.

19. The apparatus of claim 13, wherein the controller is further configured to cause the apparatus to:

initialize the memory device based at least in part on a host device changing a frequency, the host device changing a voltage, the memory device performing a self-refresh operation, the memory device changing power states, or a combination thereof, wherein the command is received based at least in part on initializing the memory device.

20. A non-transitory computer-readable medium storing code, the code comprising instructions executable by a processor to:

generate, by a memory device, a first clock signal based at least in part on a second clock signal that is received by the memory device;

receive, by the memory device, a command based at least in part on generating the first clock signal;

execute an operation to determine a phase of the first clock signal relative to the second clock signal based at least in part on receiving the command; and transmit, via at least one pin of the memory device, signaling indicating that the operation to determine the phase of the first clock signal relative to the second clock signal was successfully executed.

\* \* \* \* \*